United States Patent [19]
Miura et al.

[11] 3,955,148
[45] May 4, 1976

[54] SAMPLING CIRCUIT

[75] Inventors: Hideki Miura, Tokyo; Toshihiro Fujimoto, Ichikawa, both of Japan

[73] Assignee: Sony Corporation, Tokyo, Japan

[22] Filed: Apr. 25, 1975

[21] Appl. No.: 571,690

[30] Foreign Application Priority Data
May 9, 1974 Japan............................ 49-52634[U]

[52] U.S. Cl................................ 330/29; 307/248; 330/38 M; 357/37
[51] Int. Cl.² ........................................ H03G 3/18
[58] Field of Search ......... 330/29, 38 M, 145, 38 R; 307/248; 357/37

[56] References Cited
UNITED STATES PATENTS
3,169,222 2/1965 Krugman et al. .................. 330/38 R

*Primary Examiner*—James B. Mullins
*Attorney, Agent, or Firm*—Hill, Gross, Simpson, Van Santen, Steadman, Chiara & Simpson

[57] ABSTRACT

A sampling circuit is provided which includes a four-terminal semiconductor device of the type having a low emitter doping concentration. The signal to be sampled is fed continuously through the semiconductor device to an output terminal. A gating pulse applied between the gate and the emitter of the semiconductor device raising the current amplification characteristic $h_{FE}$ from a very low level to a high level during the period that the gating pulse is on. This causes a highly amplified signal to appear at the output. When the gating pulse is removed the current amplification characteristic $h_{FE}$ returns to low level and the amplitude of the signal at the output becomes very low.

3 Claims, 7 Drawing Figures

SAMPLING CIRCUIT

BRIEF SUMMARY OF THE INVENTION

Briefly, the present invention relates to a samplingg circuit which includes a four-terminal semiconductor device of the type having a low emitter doping concentration. The signal to be sampled is fed continuously through the semiconductor device to an output terminal. A gating pulse is applied between the gate and the emitter of the semiconductor device raising the current amplification characteristic $h_{FE}$ from a very low level to a high level during the period that the gating pulse is on. This causes a highly amplified signal to appear at the output. When the gating pulse is removed, the current amplification characteristic $h_{FE}$ returns to low level and the amplitude of the signal at the output becomes very low.

The semiconductor device employed is a novel device which is somewhat like that shown in Application, Ser. No. 427,647, filed Dec. 26, 1973, assigned to the same assignee as the present invention, with the exception that the floating fourth region is provided with an electrode to cause the fourth region to act as a gate. More specifically, the semiconductor device is a four-layer device in which there is a first region of a one impurity type, a second region of the opposite impurity type, a third region of the first impurity type and a fourth region of the second impurity type. The first, second, third and fourth regions provide the emitter, the base, the collector and the gate, respectively of the device. The spacing between the gate-emitter junction and the emitter-base junction is less than the diffusion length of the minority carriers in the emitter region.

The impurity doping in the first and third regions is low, for example, $10^{15}$ atoms/cm$^3$. The impurity doping of the second and fourth regions is, for example, $10^{19}$ atoms/cm$^3$.

BRIEF DESCRIPTION OF THE DRAWINGS

FIG. 7 is a circuit diagram of the sampling circuit of a preferred embodiment of the present invention.

DESCRIPTION OF THE PREFERRED EMBODIMENTS

Figure 1:
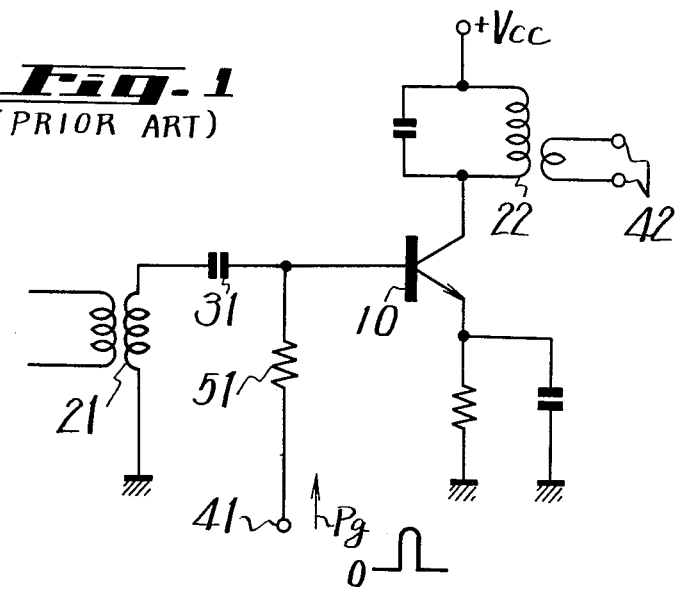
FIG. 1 is a circuit diagram of a sampling circuit found in the prior art.

Before giving a detailed description of a preferred embodiment of the present invention, reference is made to FIG. 1, which diagrammatically illustrates a prior art sampling circuit. In this circuit, the signal to be sampled is fed through a transformer 21 and a capacitor 31 to the base of a conventional NPN-type transistor 10. The emitter of the transistor 10 is connected through a resistor to ground, and also through a capacitor to ground to provide the customary emitter bias. A potential source $V_{CC}$ is connected through a tuned circuit 22 to the collector of the transistor 10. The tuned circuit is of the conventional L-C type. The output 42 is inductively coupled to the inductance element of the tuned circuit 22. The gating pulse is applied from terminal 41 through the resistor 51 to the base input circuit. Thus, the gating pulse is superimposed on the signal.

Figure 2:
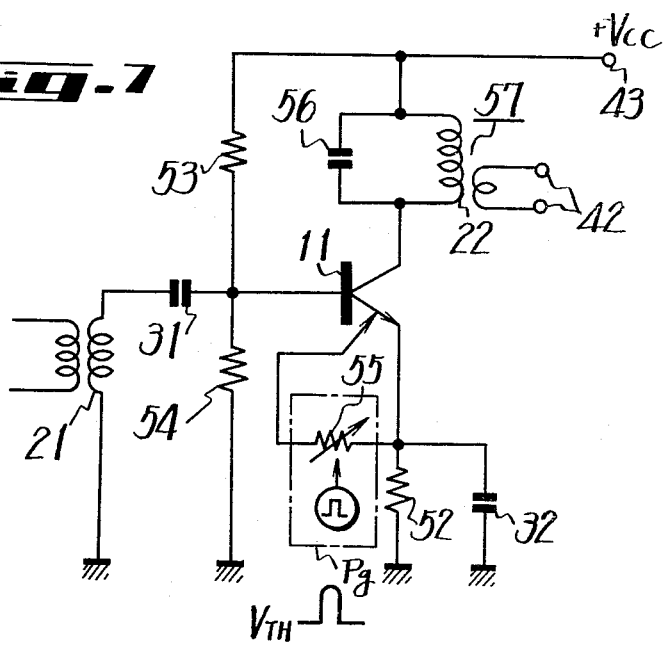
FIG. 2 is a diagrammatic illustration of the novel four-terminal semiconductor device of the present invention.
Figure 2:
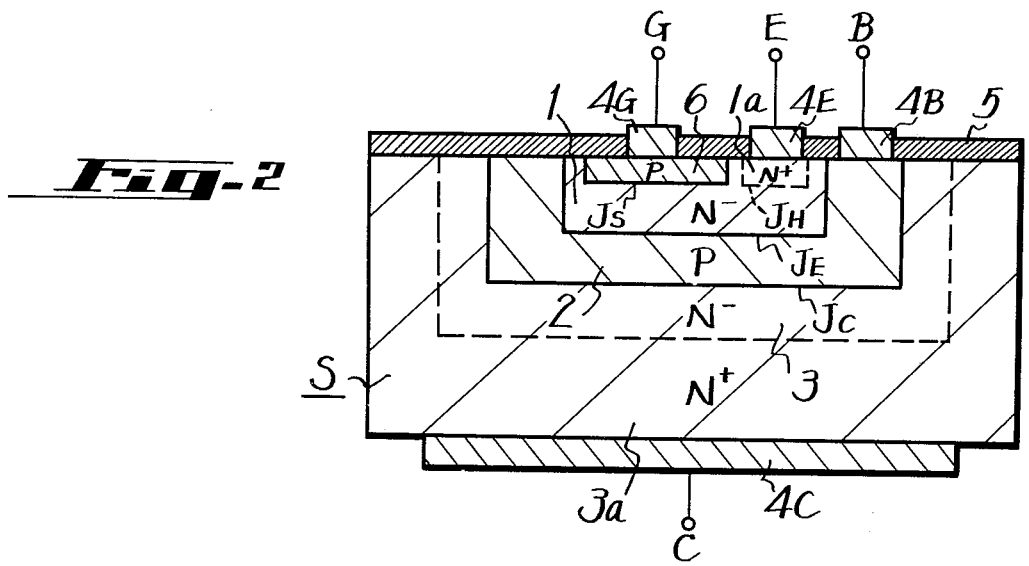

The sampling circuit of the present invention includes a novel semiconductor device which is diagrammatically illustrated in FIG. 2. The device illustrated by way of example includes a silicon body having an N$^-$ type emitter region 1, a P type base region 2 and an N$^-$ type collector region 3. A base emitter junction $J_E$ is formed between the emitter region 1 and the base region 2. A fourth region 6 is a P type region formed in the upper part of the emitter 1 and having a junction $J_S$ therewith. The spacing between the $J_S$ junction and the $J_E$ junction is less than the diffusion length of minority carriers in the emitter region 1. The region 6 acts as a gate and is provided with a gate electrode 4G which in turn is connected to a terminal G. The emitter region 1 has a high impurity concentration N$^+$ region 1a, located in its upper surface and spaced from the P type region 6. This N$^+$ region 1a forms a $J_H$ junction with the low impurity type N$^-$ region of the first region 1. This also aids in providing good operating characteristics of the device. The N$^+$ region is provided with an electrode 4E which in turn is connected to a terminal E. The base region 2 is provided with an electrode 4B, which is connected to a terminal B. The upper surface of the device apart from the electrodes is covered with an insulating layer 5. Surrounding the collector region 3 is an N$^+$ additional region 3a, which in turn is provided with an ohmic contact 4C, the latter being connected to a terminal C.

In the device shown, since the diffusion distance $L_p$ of the holes (the minority carriers) injected into the first region 1 is long, and hence the holes arrive effectively at the additional region 6 and are then absorbed thereby. If the additional region 6 is floated, its potential is increased as the number of holes arriving at the additional region 6 is increased. Thus, the PN junction $J_S$ formed between the regions 6 and 1 is biased forwardly to its rising-up voltage substantially, and then holes will be re-injected to the first region 1 from the additional region 6. Thus, the concentration of holes in the first region 1 near the additional region 6 will be increased, and, accordingly, the concentration distribution of holes between the junctions $J_E$ and $J_S$ in the first region 1 is made uniform and the gradient thereof becomes gradual to reduce the diffusion current $J_p$ from the second region 2 to the first region 1.

When the additional region 6 is provided with an electrode, however, the additional region 6 may be used as a gate.

A preferred embodiment of the present invention is illustrated diagrammatically by the circuit diagram of FIG. 7. Here, the signal to be sampled is fed through a transformer 21 and a capacitor 31 to the base of a semiconductor device 11 which is of the type shown in FIG. 2. A potential source $V_{CC}$ is connected through a terminal 43 and through a pair of serially connected resistors 53 and 54 to ground. The mid-point between these two resistors is connected to the base to provide the necessary bias. The collector of the semiconductor device 11 is connected to the potential source $V_{CC}$ through a tuned circuit 22 which is formed by a capacitor 56 and an inductance element 57. This tuned circuit is tuned to the frequency of the incoming signal. The output 42 is inductively coupled to the inductance element 57 of the tuned circuit 22. The emitter of the semiconductor device 11 is connected through a resistor 52 and a parallel capacitor 32 to ground. The sampling pulse is applied between the gate and the emitter of the semiconductor device 11. The sampling pulse is indicated as 55, the symbol indicating the internal resistance of the sampling pulse which may have different values of resistance.

Figure 3:
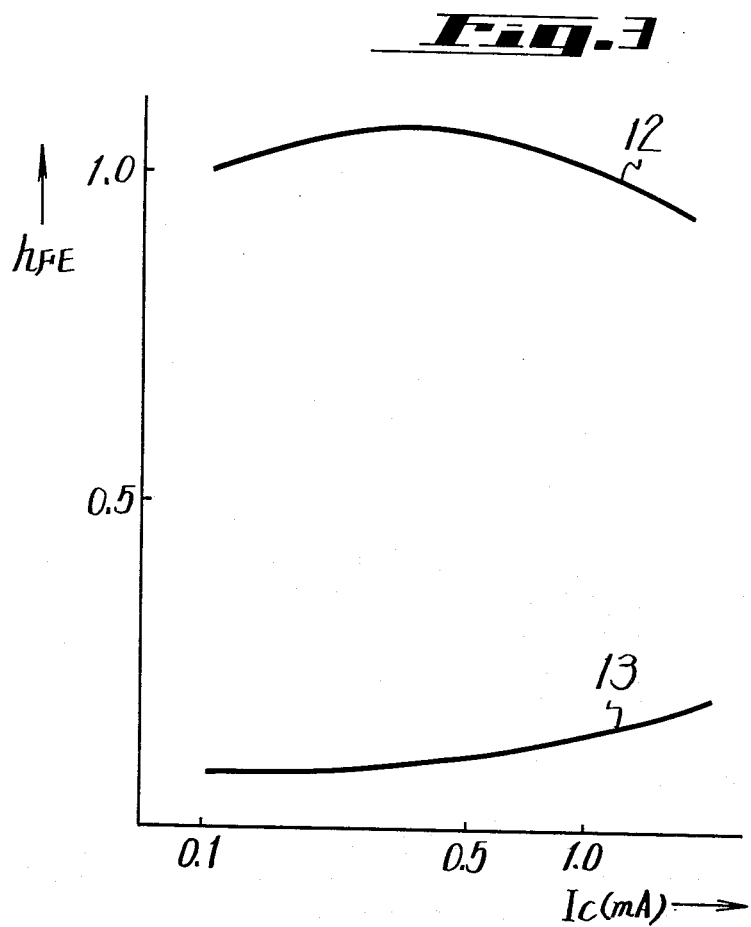
FIG. 3 is a set of curves showing the relationship between the amplification characteristic $h_{FE}$ and the collector current when a sampling pulse is applied to the gate of the semiconductor device and when there is no sampling pulse applied to the gate.

Referring to the graphs of FIGS. 3 to 6 and bearing in mind that the amplification characteristic $h_{FE}$ is greatly increased during the period when the sampling pulse is being applied, the relationship of the amplification characteristic $h_{FE}$ to other parameters is shown. FIG. 3 gives the relationship of the amplification characteristic $h_{FE}$ to collector current when the voltage pulse is being applied (curve 12) and when no voltage pulse appears on the base (curve 13).

Figure 4:
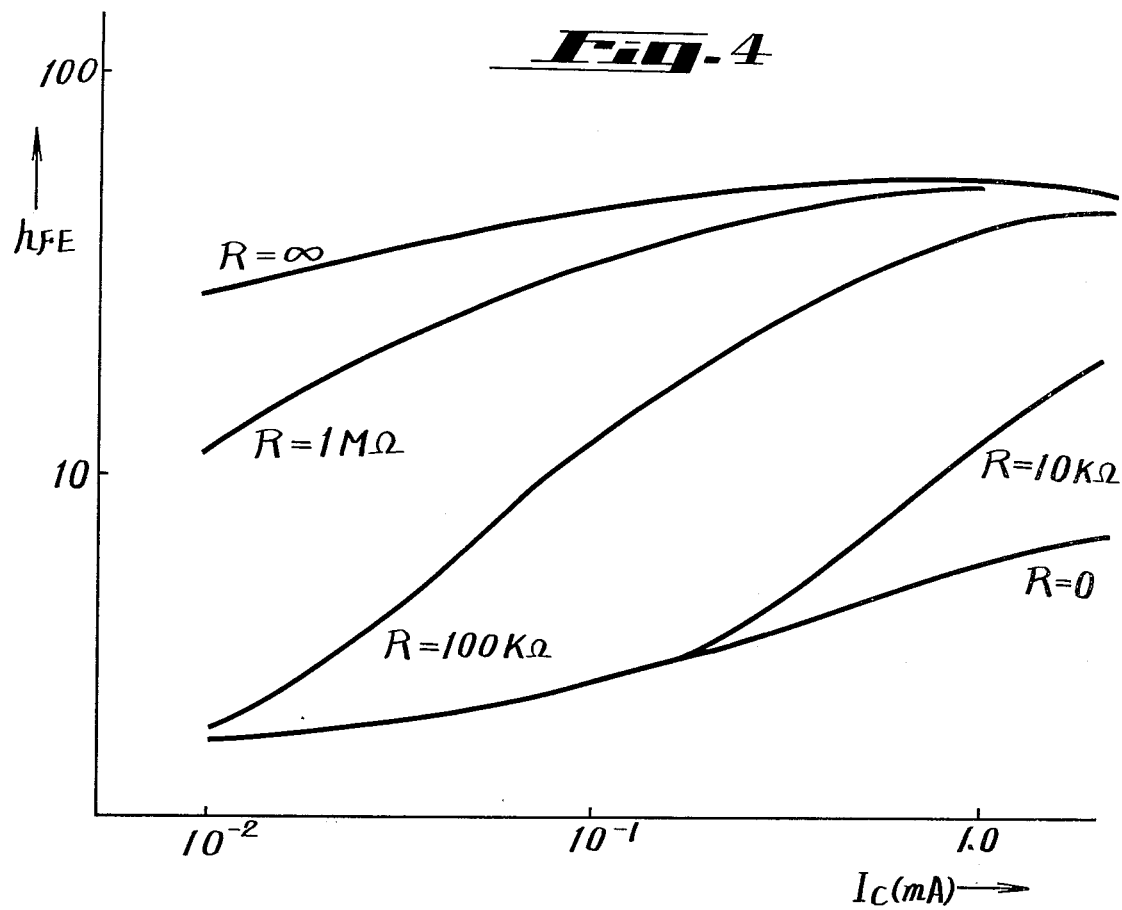
FIG. 4 is a set of curves showing the relationship between the amplification characteristic $h_{FE}$ to the collector current when the parameter R is varied.

FIG. 4 shows the relationship of the amplification characteristic $h_{FE}$ to the collector current when the parameter R (the internal resistance of the pulse source) is varied.

Figure 5:
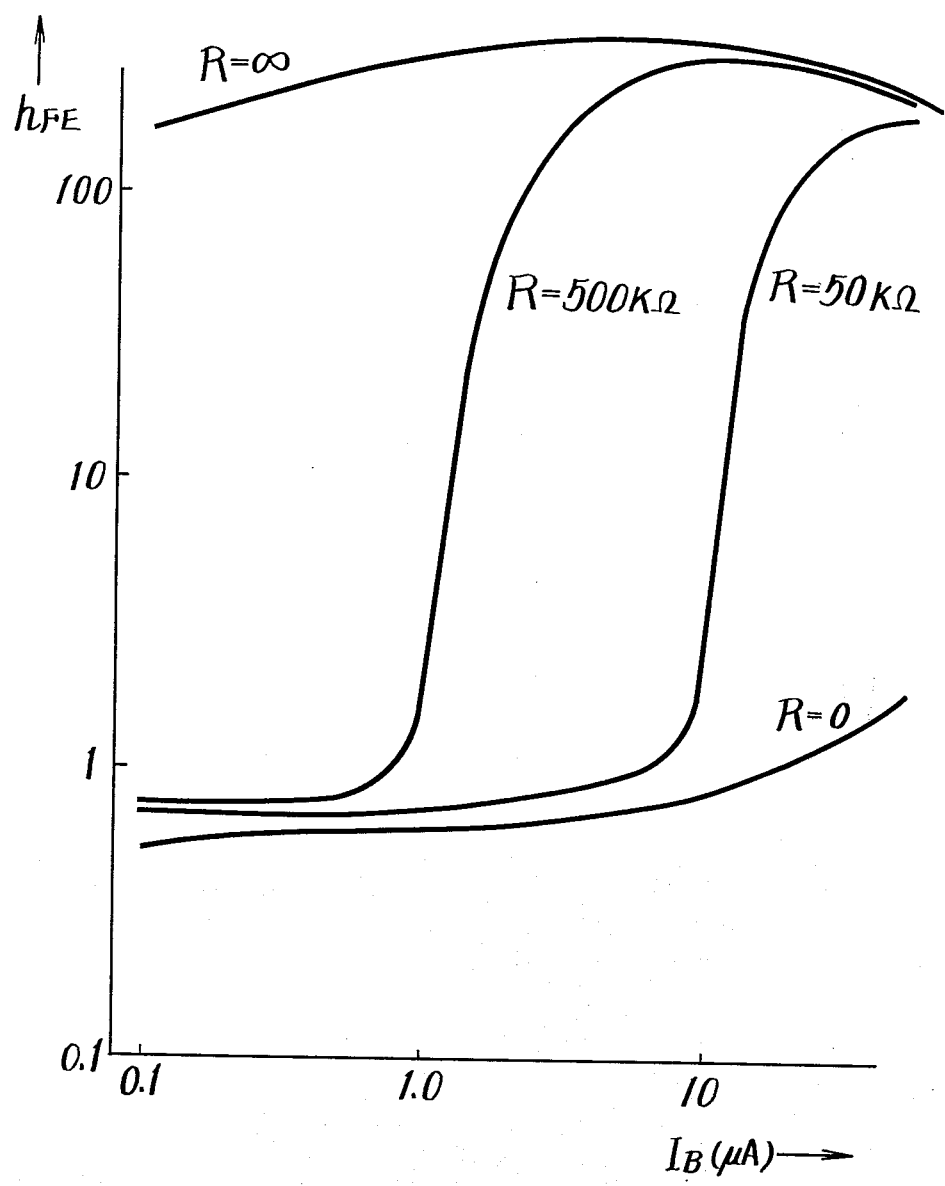
FIG. 5 is a set of curves showing the relationship of the amplification characteristic $h_{FE}$ to the base current when the resistance of the pulse source has different representative values.

FIG. 5 shows the relationship of the amplification characteristic $h_{FE}$ to the base current when the parameter R (internal resistance of the pulse source) is varied.

Figure 6:
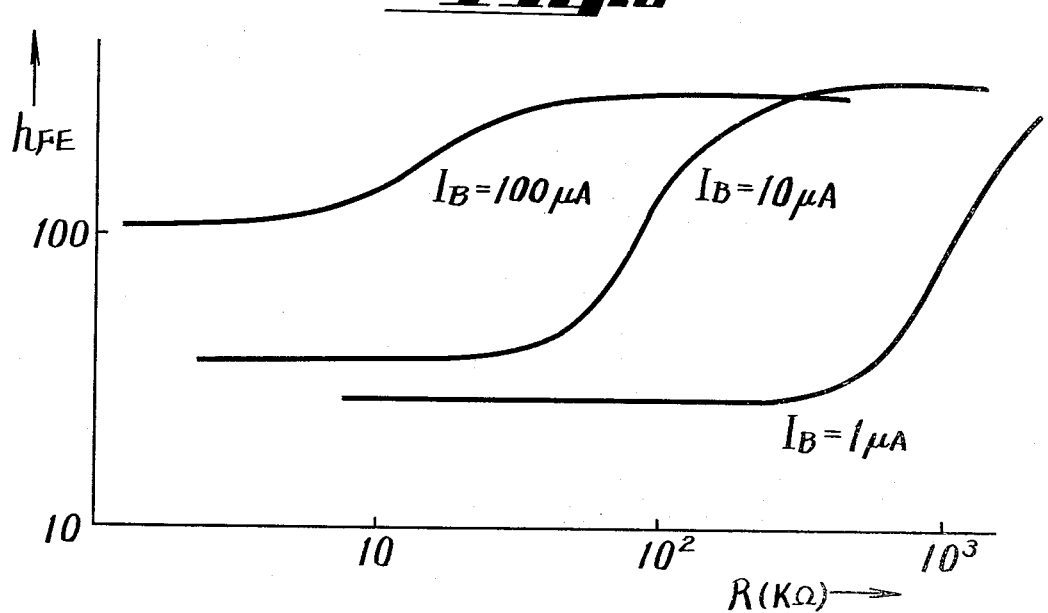
FIG. 6 is a set of curves showing the relationship of the amplification characteristic $h_{FE}$ to internal resistance of the pulse source for different representative values of base current.

FIG. 6 illustrates the relationship of the amplification characteristic $h_{FE}$ to R (the internal resistance of the pulse source) when the base current has different parameters.

It is to be noted in the operation of the above sampling circuit that the semiconductor device is on all the time, and thus, the signal to be sampled is passed to the output at all times, although at a very low level. The pulse increases the amplification characteristic $h_{FE}$ from the low point to a high level during the period of time that the pulse is on. Thus, during the sampling period, the signal appears at a high level at the output.

It will be apparent to those skilled in the art that many modifications and variations may be effected without departing from the spirit and scope of the novel concepts of the present invention.

I claim as my invention:

1. A sampling circuit comprising a semiconductor device having a base having a major interface adjoining a collector, an emitter having a major interface adjoining the other major face of said base and having an emitter-base junction therebetween, a gate having an interface adjoining the other major interface of said emitter and having a gate-emitter junction therebetween, said emitter and said collector having a low concentration of impurities of one type, said base and said gate having impurities of the opposite type, said emitter-base junction being spaced from said gate-emitter junction by a distance less than the diffusion length of minority carriers in said emitter, circuit means for feeding a signal to be sampled across the base and emitter of said semiconductor device, circuit means connecting an output to the collector of said semiconductor device, and means for applying a gating pulse between the gate and emitter, thereby to increase the amplification characteristic $h_{FE}$ during the gating period.

2. A sampling circuit according to claim 1, in which said collector is biased through a tuned circuit which is tuned to the frequency of the signal being sampled.

3. A sampling circuit according to claim 1, in which said base is biased by connection to the mid-point of a pair of resistors which are serially connected between a potential source and ground, and in which said collector is biased through a tuned circuit connected to said potential source.

* * * * *